United States Patent [19]
Palinkas

[11] Patent Number: 4,901,043
[45] Date of Patent: Feb. 13, 1990

[54] COMPACT FILTER HAVING A MULTI-COMPARTMENT HOUSING

[75] Inventor: Raymond W. Palinkas, Clay, N.Y.

[73] Assignee: Andrew F. Tresness, Syracuse, N.Y.

[21] Appl. No.: 69,521

[22] Filed: Jul. 2, 1987

[51] Int. Cl.$^4$ .............................................. H03H 7/12
[52] U.S. Cl. ..................................... 333/175; 333/176; 333/185
[58] Field of Search ............... 333/185, 176, 175, 132, 333/168, 126, 129, 134, 202, 174

[56] References Cited

U.S. PATENT DOCUMENTS

| | | | |
|---|---|---|---|
| 2,248,787 | 7/1941 | Schrumpf | 333/175 |
| 2,768,351 | 10/1956 | Scholten et al. | 333/129 |
| 2,988,713 | 6/1961 | Fukata | 333/168 |
| 3,504,317 | 3/1970 | Sato et al. | 333/132 |
| 3,624,565 | 11/1971 | Harris et al. | 333/185 X |
| 3,644,848 | 2/1972 | Kruczek | 333/185 |
| 3,733,608 | 5/1973 | McGray et al. | 333/134 X |
| 3,763,447 | 10/1973 | Takahashi et al. | 333/202 |
| 3,820,045 | 6/1974 | Igarashi | 333/185 |
| 3,922,623 | 11/1975 | Bucherl | 333/167 |
| 4,451,803 | 5/1984 | Holdsworth et al. | 333/185 X |
| 4,456,895 | 6/1984 | Landt et al. | 333/177 |
| 4,494,095 | 1/1985 | Noji et al. | 334/85 |
| 4,586,009 | 4/1986 | Ciszek | 333/176 X |
| 4,672,337 | 6/1987 | Thibeault | 333/185 X |
| 4,701,726 | 10/1987 | Holdsworth | 333/185 |

FOREIGN PATENT DOCUMENTS 83108  7/1981  Japan ................................. 333/185

OTHER PUBLICATIONS

Dankai, Atilla; "Small-Size High-Stability VHF & UHF Duplex Filters for Mobile Radio Communication"; *Budavox Telecommunication Review*; Hungary; No. 4 (1978), pp. 1-6.

Primary Examiner—Eugene R. LaRoche
Assistant Examiner—Benny T. Lee
Attorney, Agent, or Firm—Berman, Aisenberg & Platt

[57] ABSTRACT

A filter comprises components arranged in a plurality of compartments which are magnetically shielded from each other. Each compartment includes components for filtering two frequencies wherein these frequencies are separated by an amount such that inductive coupling is substantially prevented. The compartments are combined to increase the attenuation, and any number of compartments may be utilized to filter the desired number of frequencies.

8 Claims, 2 Drawing Sheets

COMPACT FILTER HAVING A MULTI-COMPARTMENT HOUSING

TECHNICAL FIELD

This invention relates to the art of electronic filters. In a preferred embodiment, the invention is a notch filter for use in cable television.

BACKGROUND ART

Filtering circuits are well-known in electronics and generally comprise inductive-capacitive circuits which are either arranged in series with input and output leads or shunt unwanted frequencies to ground. When a plurality of inductive elements are in close proximity, it is common for inductive coupling to occur. In some instances, this coupling is advantageously used to provide phase cancellation to increase the filtering capabilities of the circuit.

In cable television technology, notch filters are used to remove selected frequencies, such as those frequencies for which the subscriber has not paid. It is necessary in this art to provide at least 40 db attenuation, and this requires the use of phase cancellation techniques. Moreover, temperature and aging effects generally require filters to have at least 70 db attenuation.

To obtain greater than 40 db attenuation, it is known to provide a plurality of filters in series. At the frequencies generally employed in cable television, however, increases in attenuation are obtainable only if the filter sections are magnetically shielded from each other because of the effects of inductive coupling.

Thus, it is common to provide a first compartment having three inductive elements therein connected to a second compartment having identical inductors, wherein the two compartments are magnetically shielded from each other. Each pair of compartments filters out a single frequency, and a plurality of these units is connected together through coaxial cable connections to filter out the desired frequencies.

SUMMARY OF THE INVENTION

When a large number of discrete frequencies is to be removed, the number of notch filters in series often becomes quite large. This creates a problem for the installer because of the physical space required to support the necessary length of filters.

Prior attempts to reduce the size of a filter by placing all inductive elements in one compartment have failed because the lack of magnetic shielding permits inductive coupling which substantially reduces the amount of attenuation.

In accordance with the invention, each compartment of a filter is provided with at least two sets of inductive elements, wherein each of the sets is tuned to a different frequency. These frequencies are far enough apart that there is no substantial inductive coupling between them, thus obviating the necessity for magnetic shielding and allowing them to be placed in a single compartment.

For example, if it is desired to remove two frequencies, a first compartment having components for filtering out the two frequencies is connected to a second compartment having components for filtering out the same two frequencies, and only the two compartments are magnetically shielded from each other. The components for a first frequency in each compartment do not interact with those for the second frequency because the frequencies are spaced apart. This permits the elements required for filtering out the two frequencies to be placed in a much smaller space than heretofore.

It is an object of this invention to provide a filter for a plurality of frequencies which is compact.

Another object of this invention is to provide a unique filter wherein a plurality of inductive elements are provided in a single compartment, the elements being tuned to frequencies which do not result in inductive coupling.

DETAILED DESCRIPTION OF THE INVENTION

Figure 1:
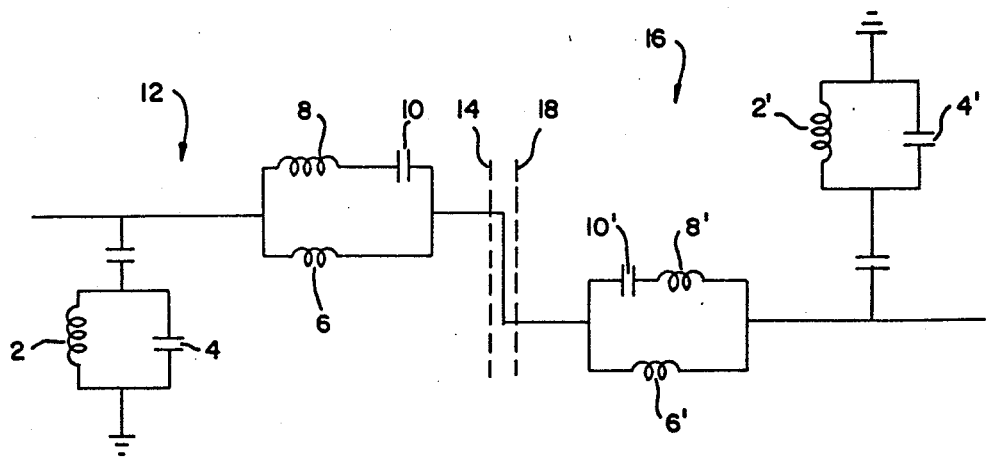
FIG. 1 is a circuit diagram of a prior art filter.
Figure 2:
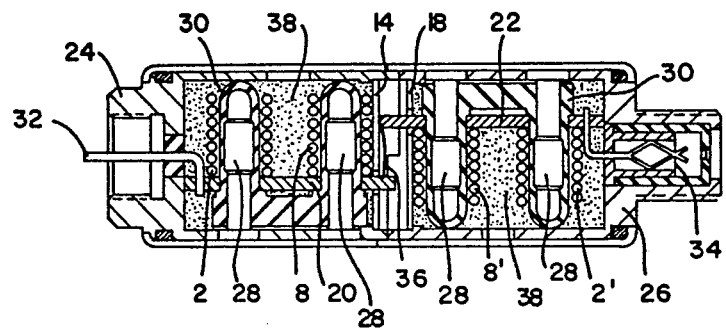
FIG. 2 is a cross-section of a prior art cable television filter.

FIGS. 1 and 2 illustrate prior art filtering systems. With reference to FIG. 1, a first filtering circuit includes an inductor 2 and capacitor 4 in parallel to direct unwanted frequencies to ground. Inductors 6 and 8 are in parallel and are arranged with capacitor 10 to provide a series circuit for removal of frequencies. These components are arranged in a compartment 12 which includes a magnetic shielding element 14.

A second compartment 16 includes a similar set of components wherein corresponding components have been identified by primed reference numerals. The second magnetic shield 18 cooperates with magnetic shield 14 to prevent coupling between the components of compartment 12 and those of compartment 16.

FIG. 2 is a cross-section of a filter utilizing the circuit shown in FIG. 1. The components of compartment 12 are mounted on a circuit board 20, and those of compartment 14 are mounted on circuit board 22. Compartment 12 is formed by a brass tube 24, while compartment 16 is formed brass tube 26. Magnetic shields 14 and 18 are formed by brass discs. Inductance is adjusted by movement of screws 28 which are preferably carried in plastic casings 30. A male connector 32 is at one end, and a female connector 34 is placed at an opposite end. Connection between the components of the two compartments is made by a wire 36. The remainders of the hollow portions of tubes 24 and 26 are filled with a potting compound 38.

The device shown in FIG. 2 is a notch filter for removal of a single frequency.

Figure 3:
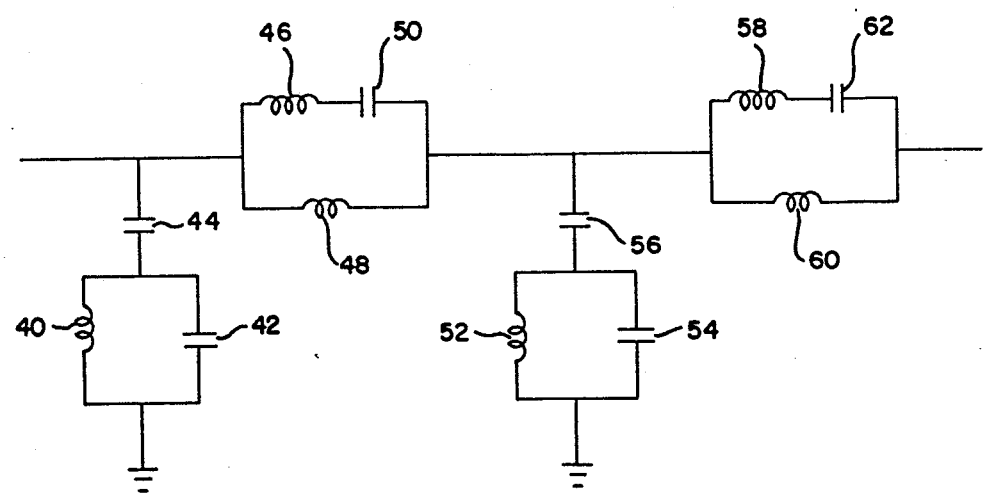
FIG. 3 is a circuit diagram of a filter in accordance with the invention.

With reference to FIG. 3, a single compartment of a filter in accordance with the invention will be described. Inductor 40, capacitor 42, capacitor 44, inductor 46, inductor 48 and capacitor 50 are arranged for removal of a first pre-determined frequency and employ phase cancellation. Inductor 52, capacitor 54, capacitor 56, inductor 58, inductor 60, and capacitor 62 are arranged for removal of a second frequency and also utilize phase cancellation. The first frequency is spaced from the second frequency by an amount whereby the first group of components does not significantly inductively interact with the second group of components.

Thus, magnetic shielding between these groups of components is not necessary.

For example, components for filtering adjacent cable television frequencies "A" (121.25 MHz) and "B" (127.25 MHz) may be placed in the same compartment. Similarly, components for non-adjacent channels such as channel 2 (55.25 MHz) and channel 7 (175.25 MHz) may be in the same compartment.

A practical minimum frequency separation has been shown at the 3 db bandwidth of each filter section.

To achieve an attenuation greater than that which can be achieved by the circuit shown in FIG. 3 alone, additional filtering circuits are provided. Because of the effects of inductive coupling, the additional circuits must be magnetically separated.

Figure 4:
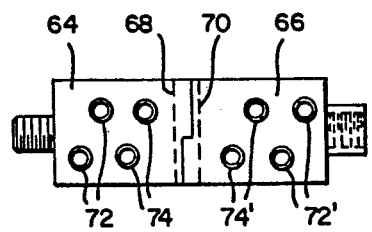
FIG. 4 is a schematic cross-section of a filter for use in cable television in accordance with the invention.

With reference to FIG. 4, a first compartment 64 is shown magnetically separated from a second compartment 66 by magnetic shields 68 and 70. The elements shown in FIG. 3 are schematically shown in the first compartment 64 of FIG. 4. The second compartment 66 contains a similar arrangement of capacitors and inductors and is connected to the components of compartment 64 by a wire (not shown), such as wire 36 shown in FIG. 2. Thus, schematically shown inductors 72 and 72' are designed to remove a first frequency, while schematically shown inductors 74 and 74' are designed to remove a second frequency.

It will be appreciated that the filter of FIG. 4 will utilize circuit board and adjusting screw features similar to those shown in FIG. 2. Of course, more plastic casings and screws will be required because of the difference between the arrangements shown in FIG. 2 and in FIG. 4 wherein each compartment of FIG. 2 contains only elements for removal of a single frequency, whereas each compartment of the arrangement of FIG. 4 contains elements for removal of two frequencies. Thus, the arrangement shown in FIG. 4 is of substantially the same size as that shown in FIG. 2 but removes two frequencies instead of the single frequency removed by the device shown in FIG. 2.

Figure 5:
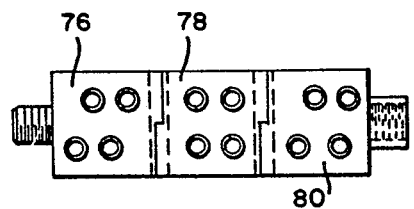
FIG. 5 is a schematic cross-section of another filter for use in cable television in accordance with the invention.

FIG. 5 shows another embodiment of the invention having compartments 76, 78 and 80. Each compartment contains components for removal of two frequencies as in FIG. 4. For example, compartment 76 may contain components related to first and second frequencies, compartment 78 may contain components related to second and third frequencies, and compartment 80 may contain components related to first and third frequencies. By this arrangement, three frequencies may be moved in a notch filter having dimensions far smaller than possible with prior art arrangements.

With proper choice of frequencies, components for removal of more than two frequencies may be placed in a single compartment.

It will be appreciated that modifications of the invention within the scope of the appended claims will be apparent to those of skill in the art.

What is claimed:

1. A filter comprising at least two compartments including first and second compartments, means for magnetically isolating said first compartment from said second compartment, first filter means for removing a first frequency range and having cooperating components in each of said first and second compartments, and second filter means for removing a second frequency range and having cooperating components in said first and second compartments, said cooperating components of each of said first and second filter means comprising discrete inductive and capacitive elements, wherein said first frequency range differs from said second frequency range by an amount such that magnetic coupling between said components of said first and second filter means in each of said first and second compartments is substantially prevented.

2. A filter according to claim 1 wherein said at least two compartments comprises more than two of said compartments wherein each compartment contains elements for removing more than two frequency ranges.

3. A filter according to claim 1 wherein each of said first and second filter means is a notch filter.

4. A filter according to claim 3 wherein each of said first and second compartments comprises a metal casing.

5. A filter according to claim 3 wherein each of said first and second frequency ranges includes a cable television frequency.

6. A filter according to claim 3 wherein said components of each of said filters comprise shunt and series circuits.

7. A filter according to claim 6 wherein said series and shunt circuits in each of said compartments are arranged to inductively couple to provide phase cancellation.

8. A filter according to claim 1 wherein said first and second compartments contain elements for removing only two frequency ranges.

* * * * *